(12) United States Patent
Bhaumik et al.

(10) Patent No.: US 8,258,861 B2
(45) Date of Patent: Sep. 4, 2012

(54) SYSTEMS AND METHODS FOR MINIMIZING POWER CONSUMPTION

(75) Inventors: Wreeju Bhaumik, Kolkata (IN); Ashok Balivada, Bangalore (IN); Senthil Gopalrao, Madurai (IN)

(73) Assignee: Analog Devices, Inc., Norwood, MA (US)

( * ) Notice: Subject to any disclaimer, the term of this patent is extended or adjusted under 35 U.S.C. 154(b) by 208 days.

(21) Appl. No.: 12/684,319

(22) Filed: Jan. 8, 2010

(65) Prior Publication Data
US 2011/0169563 A1    Jul. 14, 2011

(51) Int. Cl.
*G05F 1/10* (2006.01)
(52) U.S. Cl. .................................................. 327/544
(58) Field of Classification Search ............... 327/534, 327/535, 537, 538, 540, 543, 544
See application file for complete search history.

(56) References Cited

U.S. PATENT DOCUMENTS

| | | | |
|---|---|---|---|
| 5,781,780 A | 7/1998 | Walsh et al. | |
| 5,801,570 A * | 9/1998 | Mizuno et al. | 327/362 |
| 5,864,702 A | 1/1999 | Walsh et al. | |
| 6,157,247 A * | 12/2000 | Abdesselem et al. | 327/540 |
| 6,329,874 B1 | 12/2001 | Ye et al. | |
| 6,347,379 B1 | 2/2002 | Dai et al. | |
| 6,448,840 B2 * | 9/2002 | Kao et al. | 327/534 |
| 6,518,826 B2 | 2/2003 | Zhang | |
| 6,535,735 B2 * | 3/2003 | Underbrink et al. | 323/283 |
| 6,725,829 B2 | 4/2004 | Kataoka et al. | |
| 6,795,896 B1 | 9/2004 | Hart et al. | |
| 6,867,637 B2 * | 3/2005 | Miyazaki et al. | 327/534 |
| 6,927,619 B1 | 8/2005 | Doyle | |
| 6,967,522 B2 | 11/2005 | Chandrakasan et al. | |
| 7,113,008 B2 | 9/2006 | Perumana et al. | |
| 7,129,763 B1 | 10/2006 | Bennett et al. | |
| 7,142,009 B1 | 11/2006 | Watt et al. | |
| 7,151,417 B1 | 12/2006 | Suzuki | |
| 7,202,705 B2 | 4/2007 | Ngo et al. | |
| 7,463,057 B1 | 12/2008 | Rahim et al. | |
| 7,493,505 B2 | 2/2009 | Leung | |

(Continued)

FOREIGN PATENT DOCUMENTS

CN    101027620 A    8/2007

(Continued)

OTHER PUBLICATIONS

International Search Report and Written Opinion mailed Apr. 28, 2011 for International Application No. PCT/US2011/020491 (14 pages).

*Primary Examiner* — Jeffrey Zweizig
(74) *Attorney, Agent, or Firm* — Bingham McCutchen LLP

(57) ABSTRACT

A system for reducing power consumption in a transistor-based system includes a measurement circuit and a comparator. The measurement circuit measures a delay of a transistor-based device and produces a control signal corresponding to the measured delay. The comparator compares the control signal to a predetermined threshold. Adjusting a power supply voltage of the transistor-based system based at least in part on a result of the comparison reduces the power consumed by the system.

22 Claims, 8 Drawing Sheets

U.S. PATENT DOCUMENTS

| | | |
|---|---|---|
| 7,525,373 B1 | 4/2009 | Ogilvie et al. |
| 7,577,859 B2 | 8/2009 | Bilak |
| 7,598,731 B1 | 10/2009 | Masleid et al. |
| 7,659,772 B2 * | 2/2010 | Nomura et al. ............ 327/544 |
| 7,952,422 B2 * | 5/2011 | Chuang et al. ............ 327/534 |
| 2004/0021501 A1 | 2/2004 | Das et al. |
| 2004/0130357 A1 | 7/2004 | Smith |
| 2008/0256503 A1 | 10/2008 | Goodnow et al. |
| 2009/0031155 A1 | 1/2009 | Hofmann et al. |

FOREIGN PATENT DOCUMENTS

| | | |
|---|---|---|
| EP | 1162744 A1 | 12/2001 |
| EP | 1480112 A2 | 11/2004 |
| EP | 1519487 A1 | 3/2005 |
| WO | WO-2007130148 A2 | 11/2007 |
| WO | WO-2009037321 A1 | 3/2009 |
| WO | WO-2009104130 A2 | 8/2009 |

* cited by examiner

SYSTEMS AND METHODS FOR MINIMIZING POWER CONSUMPTION

TECHNICAL FIELD

Embodiments of the invention generally relate to systems and methods for reducing power consumption in transistor-based systems.

BACKGROUND

The power consumption of transistor-based system components (such as analog, digital, or mixed-signal integrated circuits or chips) may be classified into different categories based on the nature of the power consumed. Dynamic power consumption, for example, is related to moment-to-moment transistor function and depends on such factors as switching frequency and the number of transistors switching (for digital systems), power output and bias levels (for analog systems), or both (for mixed-signal systems). In general, dynamic power consumption is independent of process and temperature variations and is approximately equal to $C \times V_{DD}^2 \times f$ for a given capacitance C, power supply voltage $V_{DD}$, and switching frequency f.

Leakage power consumption, on the other hand, is largely independent of transistor operation and is instead exponentially dependent upon process, voltage, and/or temperature. As transistors shrink, and as more transistors are used on a chip, the effects of leakage power consumption become more and more significant.

For example, the speed of a complementary metal-oxide-silicon (CMOS) integrated circuit is largely determined by the threshold voltages of its n-type (NMOS) and p-type (PMOS) transistors (i.e., lower threshold voltages allow faster switching times). FIG. 1 shows a typical. Gaussian statistical distribution 102 for threshold voltages across a sampling of transistors produced by a typical integrated-circuit manufacturing process. As the distribution 102 shows, most transistors have a typical threshold voltage, and the number of transistors decreases as the threshold voltage increases or decreases from typical.

Because integrated circuits are typically designed to operate under a variety of conditions, the voltage and frequency of operation may be chosen so that devices at the slow process corner 104 will operate reliably. This selection, however, means that the majority of devices that do not lie at the slow process corner 104 will operate with a greater $V_{DD}$ than necessary, thereby increasing both their dynamic and leakage power consumption (which, as described above, are both strongly dependent on $V_{DD}$). In particular, devices at the fast process corner 106 (having relatively low threshold voltages) will exhibit the maximum leakage current. The leakage power consumption in the fast process corner 106 is typically 30 to 50 times that in the slow process corner 104. In addition to consuming unnecessary power, devices operating at the fast process corner 106 will also produce additional heat. The design of some integrated-circuit components, such as the package unit, is sensitive to thermal characteristics, and the cost of these components may increase due to the additional heat produced at the fast process corner 106.

Because power consumption has become a greater concern for low-power portable electronic devices (such as cellular/mobile phones, portable music players, netbook/notebook computers, portable video players, and the like) as well as for nonportable devices (such as desktop computers, embedded computers, servers, and switches), the prior-art method of fixing $V_{DD}$ and frequency to suit the worst-case corner is no longer tenable. Clearly, a need exists for a way to reduce both dynamic and leakage power consumption.

SUMMARY

In various embodiments, the present invention facilitates minimizing the supply voltage level based on the actual, measured speed of the transistors on an integrated circuit and adjusting a system supply voltage accordingly to lower the voltage to a minimum operable level and thereby minimize the dynamic and leakage power consumption of the integrated circuit. Because semiconductor devices (such as transistors) having a threshold voltage greater than $V_{t\ MIN}$ (e.g., devices operating at a process corner other than a slow corner) may operate faster than a speed required by worst-case system parameters, the supply voltage of these fast devices may be safely lowered. Operating at this lower optimized voltage instead of at the nominal voltage, therefore, significantly reduces the leakage and dynamic power consumption. The corresponding reduction in total heat produced allows for the use of cheaper, less thermally-sensitive components.

Techniques and systems in accordance with the invention determine the minimum voltage at which the chip can operate by measuring the speed of the transistors on the chip and adjusting the power supply downward accordingly.

Accordingly, in a first aspect, embodiments of the invention include a system for reducing power consumption in a transistor-based device. The system includes a measurement circuit and an adjustment circuit. The measurement circuit measures a delay of at least one transistor in the device. The adjustment circuit adjusts a power supply voltage of the device based at least in part on the measured delay in order to reduce the power consumed by the device without changing the functionality of the device.

In various embodiments, the measurement circuit may produce a control signal corresponding to the measured delay and may further include a comparator for comparing the control signal to a predetermined threshold. The adjustment circuit may include or exclusively include a voltage regulator responsive to the measurement circuit, and may adjust the power supply voltage in response to a change in a temperature. A value of the measured delay may indicate a quality of the system.

The measurement circuit may include a delay-locked loop. The delay-locked loop may receive a reference clock signal including a reference delay, include a tunable delay element, include a control circuit for adjusting the tunable delay element and for producing a control signal corresponding to the measured delay, and/or include one of a digital delay-locked loop, an analog delay-locked loop, or a hybrid delay-locked loop.

A hardware register may store the control signal. A value stored in the hardware register may include at least one of a statically set threshold or a dynamically set threshold. A timer circuit may dynamically adjust the power supply voltage. In general, the transistor-based device may be a cellular phone, portable music player, portable video player, portable electronics device, A/V receiver, audio device, netbook computer, laptop computer, embedded computer, gaming device, desktop computer, server, automotive electronic device, and/or medical electronics device.

In another aspect, embodiments of the invention include a method for reducing power consumption in a transistor-based device. The method begins with measuring a delay of at least one transistor in the device. A power supply voltage of the device is adjusted based at least in part on the measured delay in order to reduce the power consumed by the device without changing the functionality of the device.

The measuring step may include generating a control signal corresponding to the measured delay and the adjustment step may include comparing the control signal to a predetermined threshold. Measuring the delay of the transistor-based device may include locking a delay loop to a reference frequency. The control signal may be fixed to a predetermined value and/or stored in a hardware register. The predetermined threshold may be a minimum control signal or a maximum control signal. The power supply voltage may be dynamically adjusted at periodic intervals during the operation of the transistor-based device with minimum interference in system operation. The power supply voltage may be adjusted at the startup of the transistor-based device.

In another aspect, embodiments of the invention may include a system for reducing power consumption in a transistor-based chip. The system includes a measurement circuit and an adjustment circuit. The measurement circuit measures a delay of at least one transistor in the chip. The adjustment circuit adjusts a power supply voltage of the chip based at least in part on the measured delay in order to reduce the power consumed by the chip without changing the functionality of the chip. The transistor-based chip may be a digital chip, an analog chip, and/or a mixed-signal chip, and may be a microprocessor, a digital-signal processor, an amplifier, an embedded processor, or a solid-state storage device.

BRIEF DESCRIPTION OF THE DRAWINGS

In the drawings, like reference characters generally refer to the same parts throughout the different views. In the following description, various embodiments of the present invention are described with reference to the following drawings, in which.

DETAILED DESCRIPTION

Figure 2:
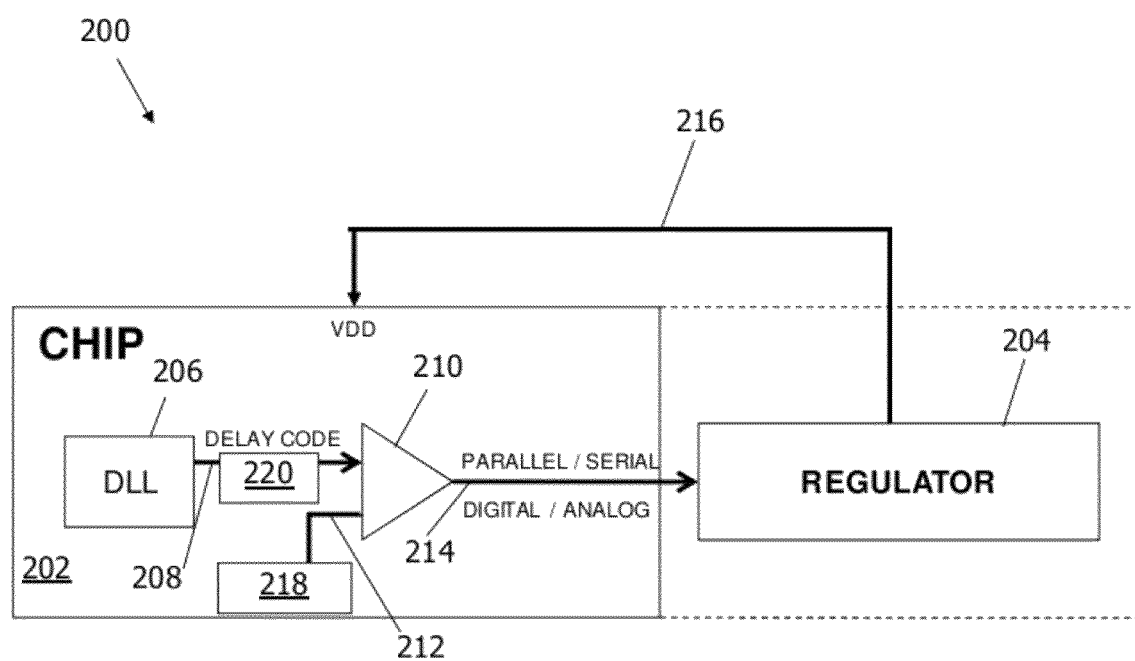
FIG. 2 is a block diagram of a system for reducing system power consumption in accordance with an embodiment of the invention.

Described herein are various embodiments of methods and systems for measuring the speed of transistors and other semiconductor devices on an integrated circuit chip or system and adjusting the system supply voltage accordingly in order to minimize the power consumption of the integrated circuit chip. The speed of a transistor generally refers to its speed in changing an output parameter in response to an input parameter, and may be defined as the propagation delay (hereinafter "delay") measured between an input event (such as an input voltage crossing a threshold) and an output event (such as an output voltage crossing a threshold). FIG. 2 is a system-level block diagram 200 that includes an exemplary integrated-circuit chip 202 and a voltage regulator 204. The voltage regulator 204 may be on-board the chip 202 or may be a discrete component. The chip 202 includes a measurement circuit 206 for measuring the speed (and, thus, the process, temperature, and voltage) of at least one transistor on the chip 202. In one embodiment, the measurement circuit 206 is a delay-locked loop (DLL), but the measurement circuit 206 may be any circuit that measures transistor speed. As explained further below, the measurement circuit 206 sends the measurement results 208 of its measurement to a comparator 210, which compares the measurement results 208 to a threshold 212. The comparator 210 produces a voltage regulator control signal 214 based on a result of the comparison and sends the signal 214 to the voltage regulator 204, which in turn adjusts the supply voltage $V_{DD}$ of the chip 202, via a regulator control signal 216, in accordance with the received comparison results 214. A first hardware register 218 may store the threshold 212, and a second hardware register 220 may store the delay code 208.

In general, the measurement and control components 206, 210 are separate and distinct from, and may be relatively small compared to, the components implementing the normal functionality of the chip 202. The chip 202 may implement any function (e.g., signal processing, amplification, etc.), include any analog, digital, or mixed-signal circuitry, and may be fabricated using any process. The measurement and control components 206, 210 are self-contained and need not borrow processing or computational power from the rest of the chip 202, if such processing power exists on the chip 202 at all.

Figure 3A:
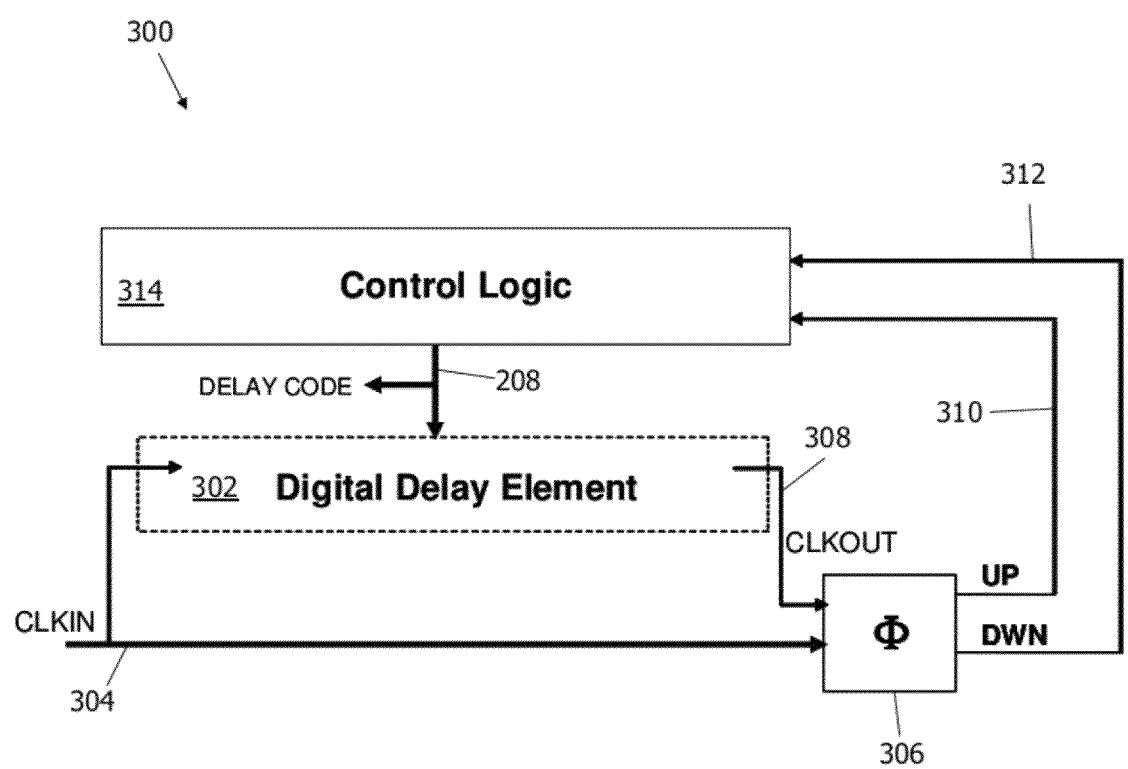
FIG. 3A is a block diagram of a digital DLL in accordance with an embodiment of the invention.
Figure 3B:
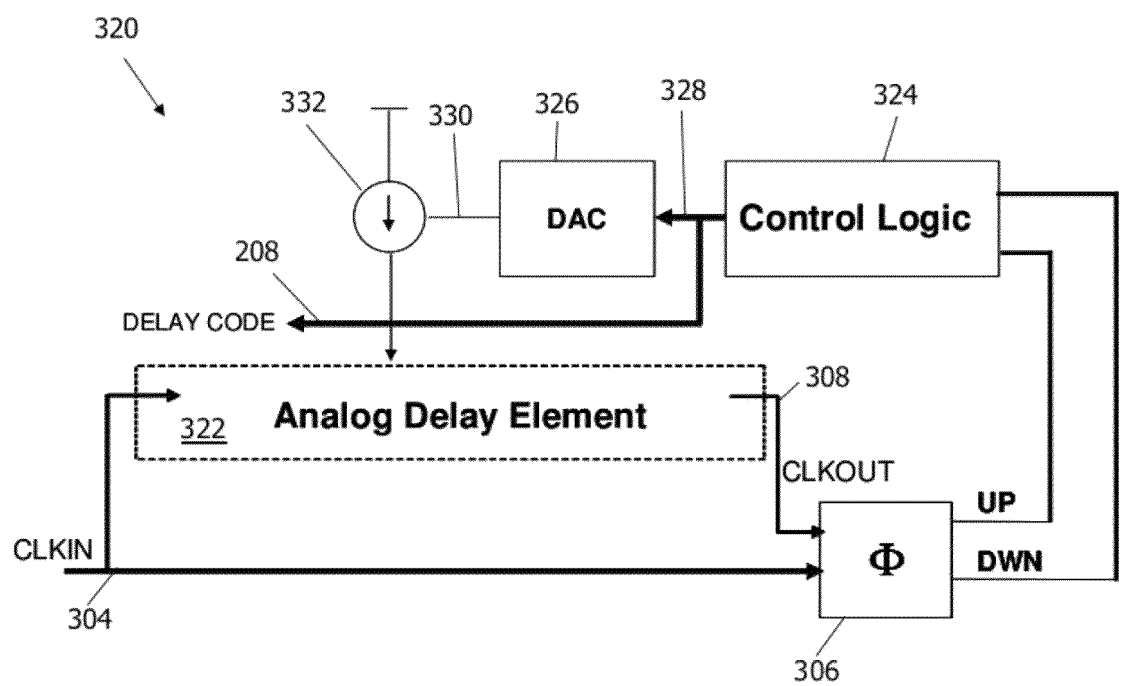
FIG. 3B is a block diagram of a hybrid DLL in accordance with an embodiment of the invention.
Figure 3C:
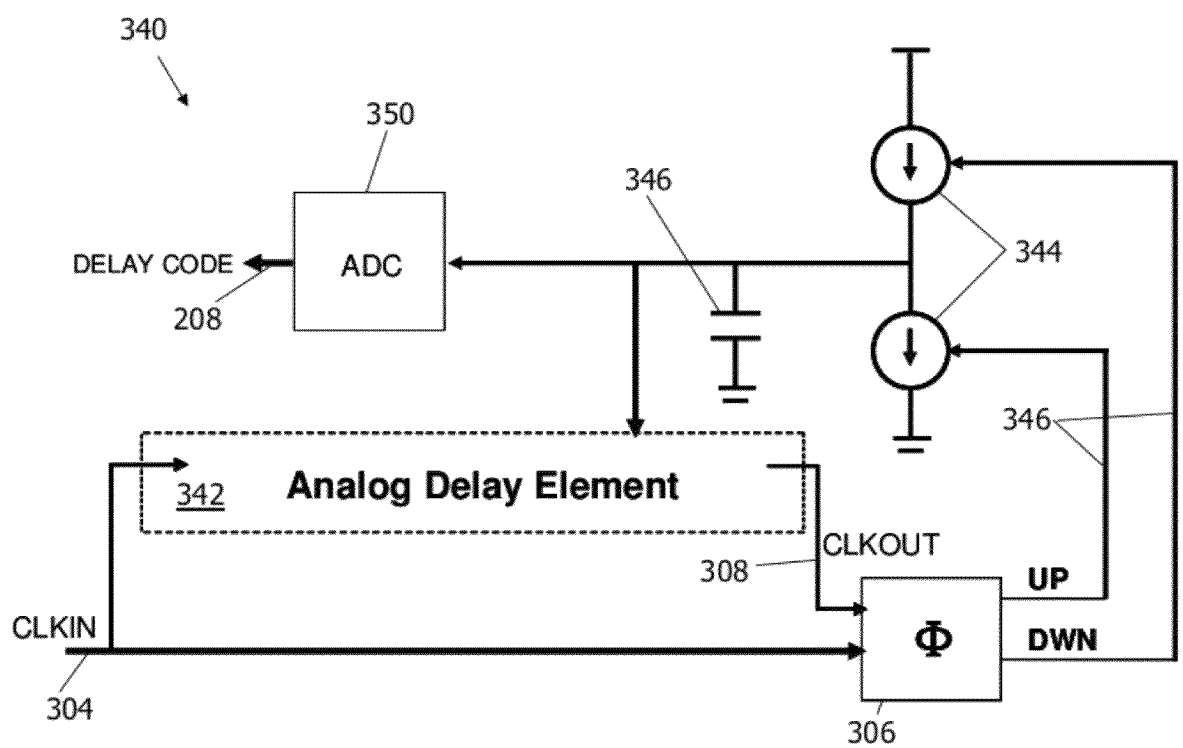
FIG. 3C is a block diagram of an analog DLL in accordance with an embodiment of the invention.

FIGS. 3A-3C illustrate, in various embodiments, DLLs configured as the measurement circuit 206. FIG. 3A is a digital-based DLL 300 that includes a digital delay element 302, which receives an incoming clock signal 304. A phase detector 306 compares the incoming clock signal 304 to a delayed version 308 of the incoming clock signal 304 produced by the digital delay element 302. The phase detector 306 asserts one of an up signal 310 or a down signal 312 depending on the phase relationship between the incoming clock signal 304 and the delayed clock signal 308. Control logic 314 adjusts the delay of the delay element 302 to reduce the phase error between the incoming clock signal 304 and the delayed clock signal 308. The phase detector 306 continues to monitor the phase error, and the control logic 314 makes further adjustments to the delay element 302 until the phase error is reduced below a threshold value (corresponding to an acceptable degree of accuracy, e.g., 1%). At this point, the latency through the delay element 302 equals or nearly equals one clock cycle of the incoming clock signal 304. The control signal from the control logic 314 corresponds to the amount of this latency and may be used as the voltage regulator control signal 214.

FIG. 3B illustrates one embodiment of a mixed-signal/hybrid-based DLL 320, having an analog delay element 322, that may be used as the measurement circuit 206. A phase detector 306 measures the phase error between the incoming clock signal 304 and the delayed clock signal 308 and sends the result of the measurement to control logic 324 (which may be similar to the control logic 314 in the digital-based DLL 300). A digital-to-analog converter (DAC) 326 converts the digital output 328 of the control logic 324 to an analog control signal 330, which may be used to control a variable current source 332. The latency through the analog delay element 322 varies in response to the changes in the variable current source 332 to thereby reduce the phase error as measured by the phase detector 306. The output 328 of the control logic 314 may be used as the voltage regulator control signal 214.

FIG. 3C illustrates one embodiment of an analog-based DLL 340, having an analog delay element 342, that may be used as the measurement circuit 206. Like the mixed-signal DLL 320, a phase detector 306 measures the phase error between an incoming clock signal and a delayed signal produced by an analog delay element. A charge pump 344 adds or removes charge on a storage capacitor 346 in response to signals 348 from the phase detector 306. The voltage on the storage capacitor 344 is used by the analog delay element 342 to adjust its latency to thereby reduce the phase error measured by the phase detector 306. An analog-to-digital converter (ADC) 350 converts the voltage on the storage capacitor 346 into the voltage regulator control signal 214.

FIGS. 3A-3C illustrate three embodiments of DLLs that may be used to generate the voltage regulator control signal 214, but the present invention is not limited to any particular DLL topology, and, in general, will work with any DLL capable of producing a control signal that correlates to a measured device speed. The voltage regulator control signal 214 may be sent to the voltage regulator 204 as parallel digital data, as serial digital data, as an analog voltage, or as any other type of information-bearing signal. Furthermore, as stated above, a DLL is only one possible implementation of the measurement circuit 206, and other measurement circuits, such as phase-locked loops, open-loop delay lines, ring oscillators, or other such circuits are within the scope of the present invention.

In one embodiment, the delay code 208 produced by the measurement circuit 206 is stored in a hardware register 220. The contents of the hardware register may be accessed by one or more output pins on the chip 202. The hardware register may have dedicated hardware pins or may share them with other chip functions. In one embodiment, the contents of the hardware register may be accessed through software, such as though a user-level application, or thorough a low-level protocol such as JTAG.

Figure 4:
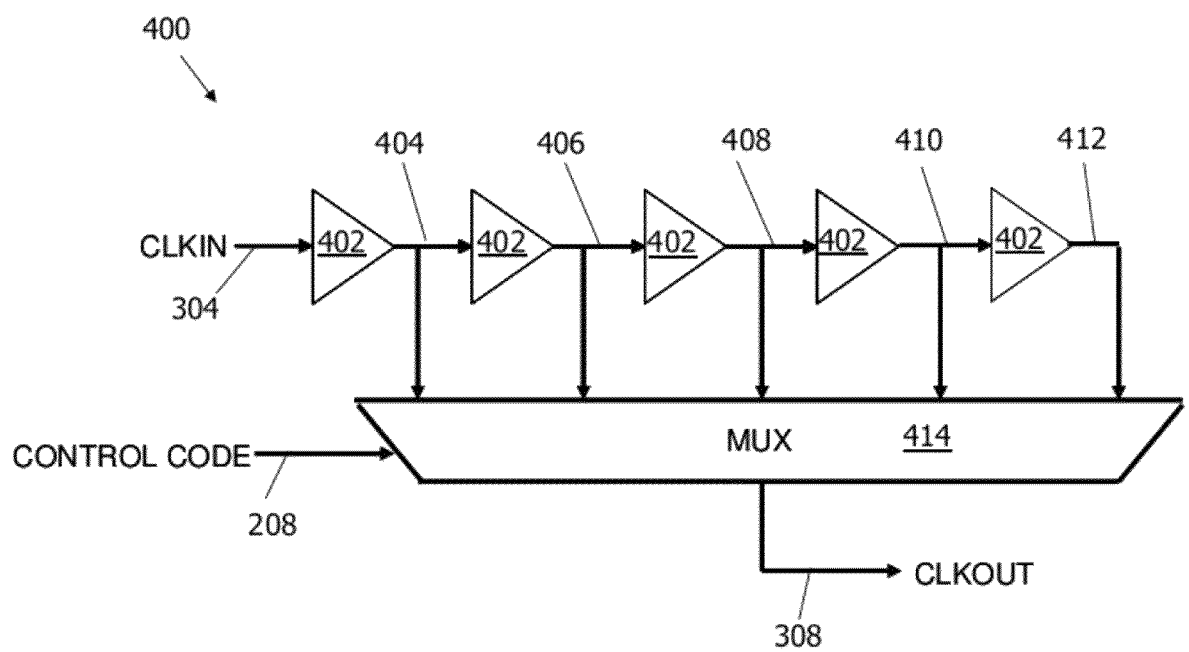
FIG. 4 is a block diagram of a digital delay element in accordance with an embodiment of the invention.

FIG. 4 illustrates one embodiment 400 of a digital delay element 302. The input clock signal 304 is routed through a number of delay primitives 402, each producing a delayed version 404-412 of the input signal 304. A multiplexer 414 selects at least one of the delayed versions 404-412, each representing a different amount of delay, based on a selection signal 208. The multiplexer 414 then outputs the clock output signal 308.

The digital delay element shown in FIG. 4 may be used to illustrate, in one embodiment, a method of operation of the present invention. If the period of the input clock signal 304 is $T_{clkin}$, if the period of the output clock signal 308 is $T_{clkout}$, and if the delay of each delay primitive 402 is $T_{delay}$, when the digital delay element 302 is locked, $T_{clkin} = T_{clkout} = $ control code $208 * T_{delay}$. In other words, the control code 208 instructs the multiplexer 414 to select one or more of the delayed versions 404-412 of the input signal 304 to produce an output signal 308 with a period $T_{clkout}$ that equals the period $T_{clkin}$, of the input clock signal 304. As described above, the control code 208 may be generated by control logic 314 in response to signals from a phase detector 306.

The period $T_{clkin}$ of the input signal 304 may remain substantially constant across variations in process, voltage, and temperature, while the delay $T_{delay}$ of each delay primitive 402 may vary with these parameters. Thus, the delay $T_{delay}$ at a first process, voltage, and temperature point $P_0, V_0, T_0$ will differ from the delay $T_{delay}$ at a second process, voltage, and temperature point $P_1, V_1, T_1$. In order to compensate for the difference in $T_{delay}$ and to ensure that $T_{clkout}$ remains equal to $T_{clkin}$ at each process, voltage, and temperature point, the control code 208 must change accordingly. In other words, a change in $T_{delay}$ will result in a corresponding change in the control code 208 when the DLL adjusts to the new conditions, and the change in the control code 208 may be examined to infer at which of the process, voltage, and temperature points the devices within delay primitive 402 are faster or slower. The relationship between the control code 208 and the delay $T_{delay}$ is summarized in the following equations:

$$\text{ControlCode}(P_0, V_0, T_0) \times T_{delay}(P_0, V_0, T_0) = T_{clkin} \quad (1)$$

$$\text{ControlCode}(P_1, V_1, T_1) \times T_{delay}(P_1, V_1, T_1) = T_{clkin} \quad (2)$$

Therefore, if $$\text{ControlCode}(P_1, V_1, T_1) > \text{ControlCode}(P_0, V_0, T_0) \quad (3)$$

then $$T_{delay}(P_1, V_1, T_1) < T_{delay}(P_0, V_0, T_0) \quad (4)$$

Thus, if the process, temperature, and/or voltage of the transistors in the delay element 302 correlate to the process, temperature, and/or voltage of the transistors used in the rest of the chip or system in which the delay element 302 is disposed, the control code 208 may be used to indicate if a chip at $P_0, V_0, T_0$ has a faster or slower speed than another chip at $P_1, V_1, T_1$. A similar analysis applies to the hybrid DLL 320, the analog DLL 340, or any other type of DLL, and produces similar results. In one embodiment, a single measurement circuit 206 (such as, for example, a DLL 300, 320, 340) may be used to determine the speed of the transistors across an entire chip; in another embodiment, multiple measurement circuits 206 may be positioned across a chip to thereby account for on-chip variations in, e.g., threshold voltage.

Figure 1:
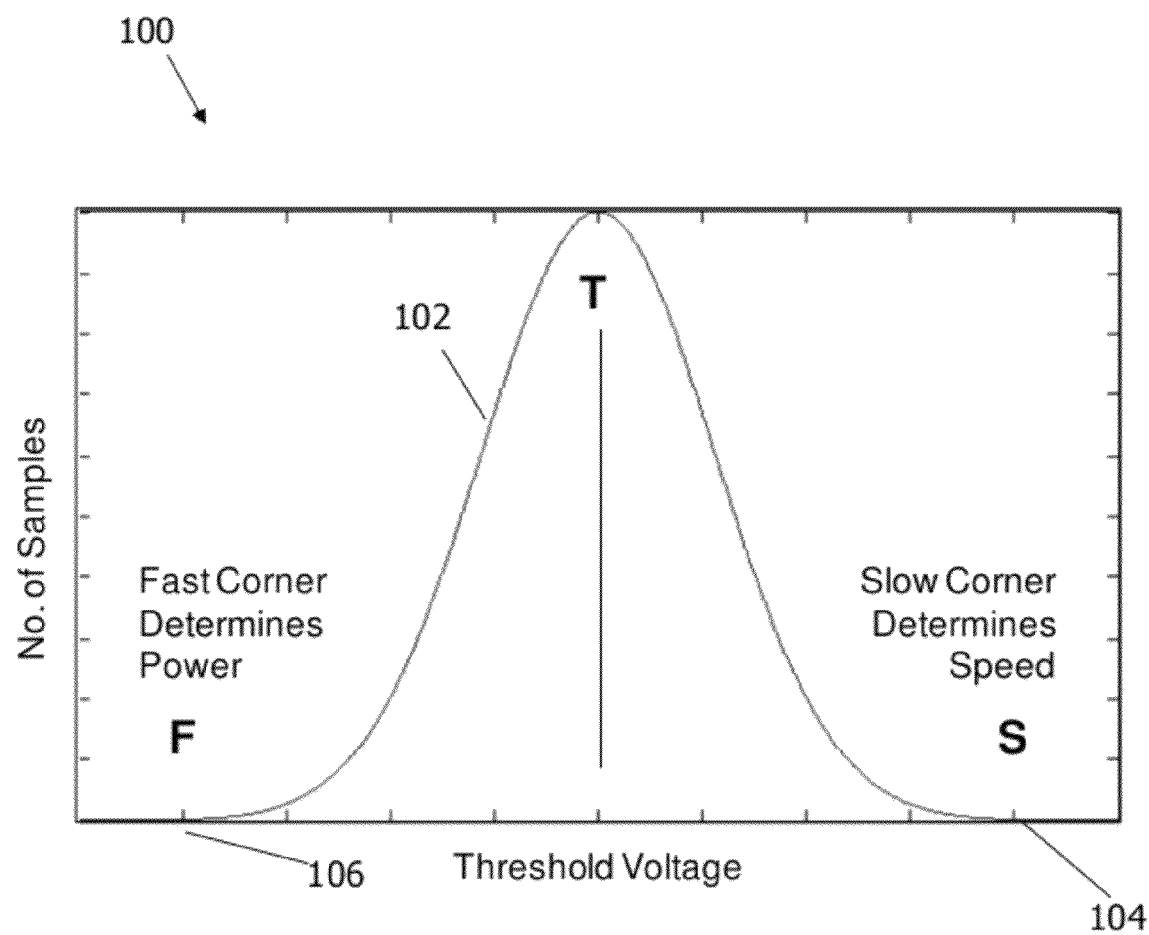
FIG. 1 is an illustration of chip process corner distribution.

In general, when a system or chip is designed and manufactured, the chips produced will exhibit performance characteristics in accordance with the distribution 102 shown in FIG. 1. Some of the manufactured chips will lie at the slow corner 104 and will, in accordance with the embodiments described above, determine a minimum control code 208 $CODE_{MIN}$. In one embodiment, $CODE_{MIN}$ is determined by simulation results with, for example, a SPICE simulation at a slow process corner. In another embodiment, $CODE_{MIN}$ is determined by testing one or more of the manufactured chips with, for example, automatic test equipment (ATE). Using direct measurement with ATE, control codes 208 may be read and stored for one or more chips that successfully pass tests in a production suite. $CODE_{MIN}$ may be determined to be the lowest measured control code 208 among the measured control codes 208 on passing chips or, alternatively or in addition, may be determined by measuring a sample of chips and extrapolating the measured results to determine $CODE_{MIN}$. In one embodiment, the chip has different speed specifications for different operating voltages and corresponding different $CODE_{MIN}$s. Once $CODE_{MIN}$ is determined, the corresponding set of chips may operate with a control code 208 that is always greater than or equal to $CODE_{MIN}$ (for the specified voltage and temperature requirements of the chip).

In one embodiment, referring again to the system-level block diagram 200 of FIG. 2, the delay code 208 may be statically set at or near the minimum delay code $CODE_{MIN}$. In this embodiment, the chip 202 voltage $V_{DD}$ is statically set to its measured worst-case value and does not change with temperature. The overall power consumption of the chip 202 may be less than prior-art systems at least because $CODE_{MIN}$ may be determined by direct measurement instead of by simulation, and thus errors in simulation leading to overly conservative safety margins may be avoided. In another embodiment, the delay code 208 may be statically set to a value slightly higher than $CODE_{MIN}$ to eliminate the devices at the slow corner of the distribution 102 from production, thereby decreasing the average power consumption of the remaining devices; in other words, the designer decides, based on characteristics of the circuit and the transistors utilized therein, where relative to the nominal conditions to set the operating voltage via $CODE_{MIN}$. In yet another embodiment, different $CODE_{MIN}$s 208 may be programmed for chips 202 being sold to different customers having different operating requirements. If, for example, a first customer's system has a minimum operating voltage specification of 2.0 volts and a second customer's system has a minimum operating voltage specification of 3.0 volts, chips sold to the second customer may have a programmed delay code 208 that takes advantage of the higher minimum voltage to thereby reduce power consumption. Differences in minimum operating frequencies or other system parameters may be similarly exploited.

In one embodiment, margins in multiple system parameters, such as system power and system frequency, are exploited simultaneously. For example, two systems A and B, each including copies of the chip 202, may have rated max operating voltages and frequencies of ($V_A$, $f_A$) and ($V_B$, $f_B$), respectively, wherein $V_A$ is different from $V_B$ and $f_A$ is different from $f_B$. Embodiments of the current invention may be used to minimize power consumption in both systems A and B merely by determining the margin on each parameter and adjusting the threshold 212 of the comparator 210 accordingly. The threshold 212 may be hardcoded into a read-only memory, fuses, or other permanent means or may be stored in a read/write memory. In one embodiment, the threshold 212 is stored in a software-writable register.

The system-level block diagram 200 of FIG. 2 may also be configured as a dynamic system. In these embodiments, a timer circuit, which may be part of the measurement circuit 208, part of the comparator 210, or a separate circuit, monitors the delay code 208 on-the-fly and instructs the voltage regulator 204 to adjust the chip 202 $V_{DD}$ accordingly. The chip 202 $V_{DD}$ may be reduced until the delay code 208 is at or near $CODE_{MIN}$. In one embodiment, the delay code 208 is determined once each time the chip 202 is powered on. Alternatively, the delay code 208 may be re-evaluated while the chip 202 is operating at periodic intervals or re-evaluated continuously. Each evaluation may occur with minimum interference to other systems on the chip 202. That is, because the systems of the present invention are self-contained and do not require additional processing power from other systems on the chip 202, the delay measurement and power supply adjustment may occur without pausing or otherwise interrupting those other systems. In each dynamic system, the current delay code 208 is compared to a reference value (e.g., $CODE_{MIN}$). This comparison may take place on the chip 202, on the voltage regulator 204, or at any other convenient point. If the comparison is performed on the chip 202, the chip 202 may send a voltage regulator control signal 214 to the voltage regulator 204 to thereby instruct the voltage regulator 204 to modify the chip 202 power supply voltage $V_{DD}$. If, instead, the comparison takes place on the voltage regulator 204, the chip 202 sends the delay code 208 to the voltage regulator 204. The voltage regulator 204 may thus contain logic circuitry to compare the delay code 208 to a reference value and determine if a $V_{DD}$ adjustment is necessary (and the magnitude thereof). The present invention is not limited to any particular design or type of voltage regulator, and one of skill in the art will understand that the delay code 208 may be modified to communicate with any voltage regulator.

In one embodiment, the chip 202 includes a temperature-monitoring circuit capable of measuring a current temperature of the chip 202. The temperature-monitoring circuit may be included as a standard component on the chip 202 (i.e., used by systems other than the power-supply control circuit of the present invention) or may be exclusively included on the chip 202 for embodiments of the present invention as part of, for example, the measurement circuit 206. In any case, the temperature-monitoring circuit may be on-chip (for example, an integrated temperature sensor) or wholly or partially off-chip (for example, a thermal diode with an external temperature sensor). The measurement circuit 206 may improve the accuracy of the delay measured by the measurement circuit 206 with data provided by the temperature-monitoring circuit, or may completely supplant the measured delay with data from the temperature-monitoring circuit.

Figure 5:
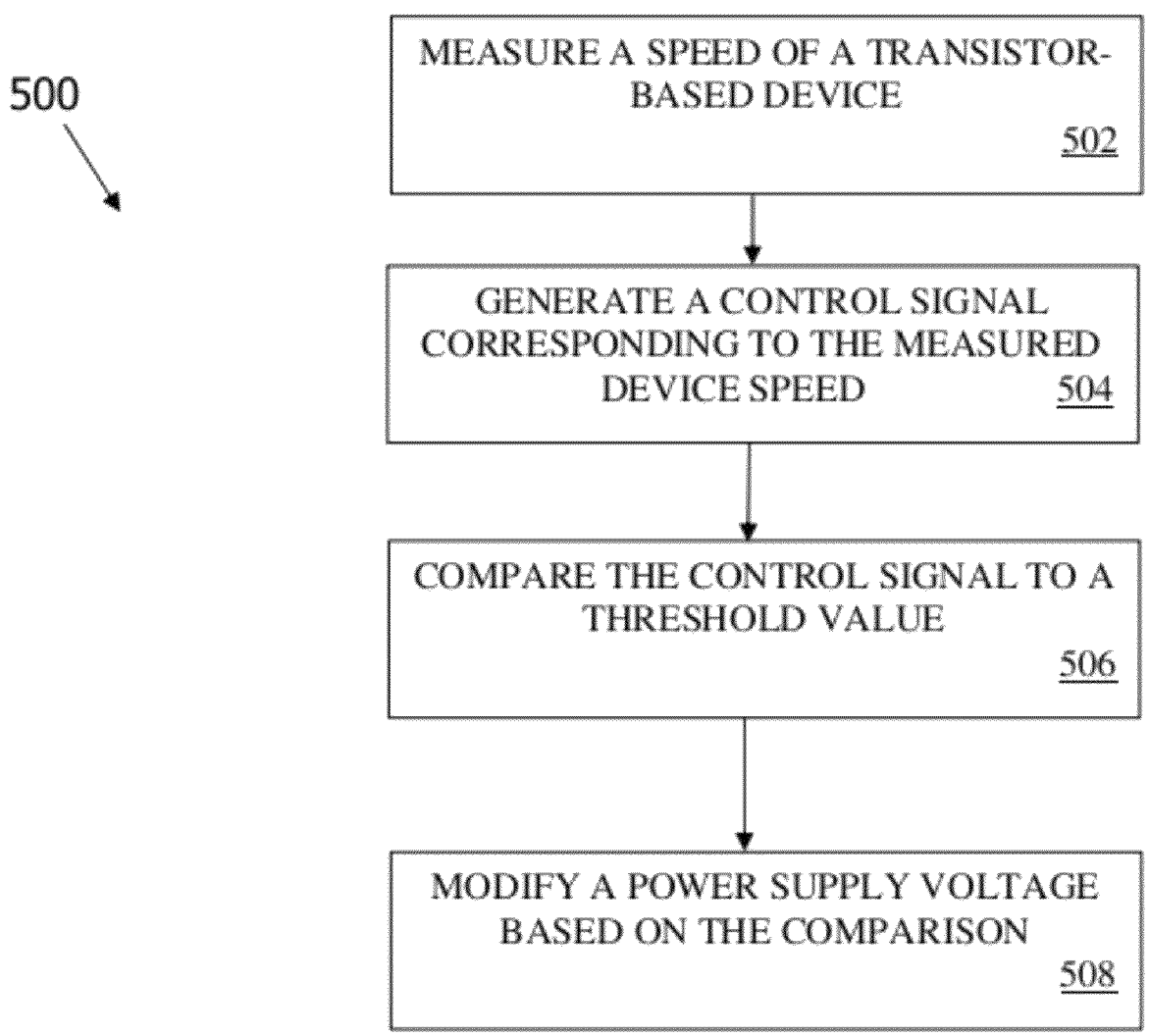
FIG. 5 is a flowchart illustrating a method of operation in accordance with an embodiment of the invention.

FIG. 5 is a flowchart illustrating, in one embodiment, a method in accordance with the present invention. The speed of a semiconductor device, such as a transistor, is measured (Step 502). As described above, the measurement may be performed by locking a DLL to a reference clock signal. A control signal is generated that corresponds to the measured device speed (Step 504) and may be a DLL control signal. The control signal is compared to a reference value (Step 506), such as $CODE_{MIN}$. In various embodiments, the reference value may be a maximum, a minimum, or some other parameter that sets a boundary for the control signal. Based on the result of the comparison, a power supply voltage is modified (Step 508). As described above, the power supply voltage may be increased or decreased depending on the relationship between the control signal and the reference value.

Figure 6:
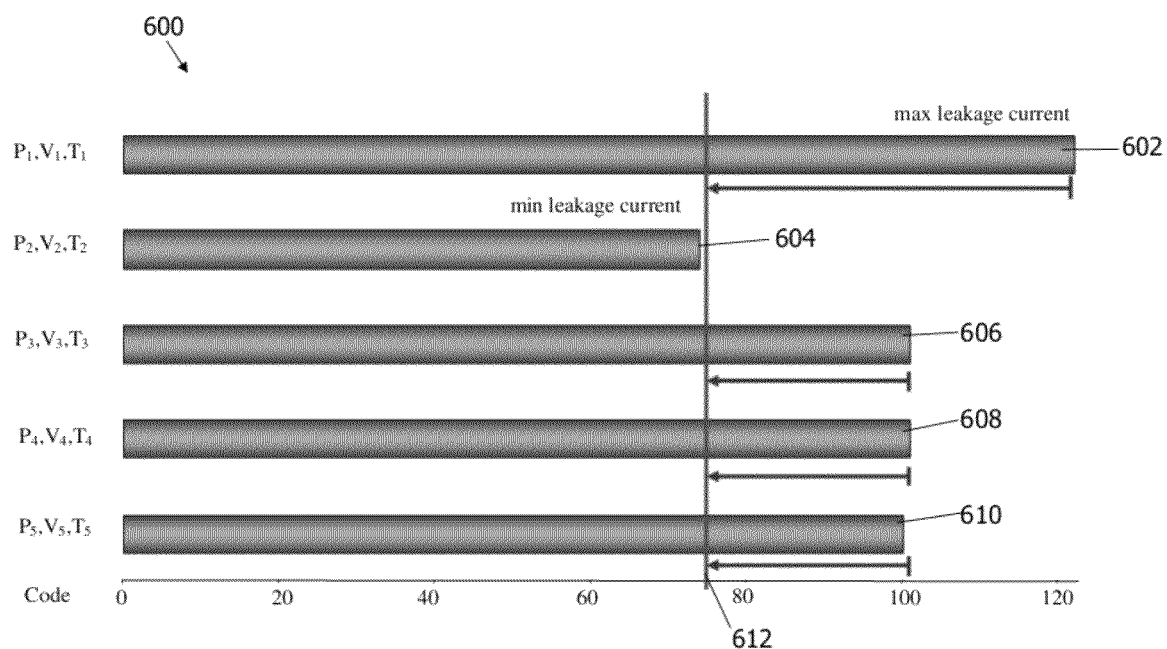
FIG. 6 is an illustration of delay codes versus process corner in accordance with an embodiment of the invention.

FIG. 6 shows a sample set 600 of delay codes 208 for a chip 202 that contains an implementation of the present invention. Several process corners 602, 604, 606, 608, 610 were measured or simulated, and a delay code 208 determined for each. The slow SS process corner 604 determines the minimum delay code 208 $CODE_{MIN}$ 612. The other process corners 602, 606, 608, 610 have a delay code 208 greater than $CODE_{MIN}$ 612 at the specified operating voltage. Thus, if a chip 202 includes devices at the other process corners 602, 606, 608, 610, the operating voltage $V_{DD}$ may be reduced accordingly the delay code 208 is at or just above $CODE_{MIN}$. As described above, reducing the operating voltage $V_{DD}$ reduces both dynamic power and leakage power. The differences in the delay codes 208 may be examined to provide quantitative diagnostic or testing data for a chip 202. For example, if a system using the chip 202 produces a delay code 208 with a high value, the power supply voltage of the chip 202 may be reduced by a proportionally large margin. If the code 208 is less high, the margin of reduction will be correspondingly lower. If the chip 202 fails, the delay code 208 may indicate a severity of the failure.

As described above, embodiments of the current invention may be used in any transistor-based device in which power consumption is a concern. Examples of such devices include portable electronic devices powered by a finite power source (such as a battery) or non-portable large-scale devices, such as server farms, mass-storage devices, or supercomputers. Other types of electronic devices, such as embedded devices, may also benefit from a reduction in power consumption. Examples of the above devices include cellular phones, portable music players, portable video players, portable electronics devices, A/V receivers, audio devices, netbook computers, laptop computers, embedded computers, gaming devices, desktop computers, servers, electronic automotive systems, or medical electronics devices. In general, embodiments of the present invention may be used in any digital, analog, or mixed-signal transistor-based chip.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and the scope of the invention. As such, the invention is not to be defined only by the preceding illustrative description.

What is claimed is:

1. A system for reducing power consumption in a transistor-based device, the system comprising:
    a measurement circuit for measuring a delay of at least one transistor in the device and for producing a control signal corresponding to the measured delay;
    a hardware register for storing the control signal;
    a comparator for comparing the control signal to a predetermined threshold; and
    an adjustment circuit for adjusting a power supply voltage of the device based at least in part on the measured delay in order to reduce the power consumed by the device without changing the functionality of the device.

2. The system of claim 1, wherein the adjustment circuit comprises or consists of a voltage regulator responsive to the measurement circuit.

3. The system of claim 1, wherein a value of the measured delay indicates a quality of the system.

4. The system of claim 1, wherein the adjustment circuit adjusts the power supply voltage in response to a change in a temperature.

5. The system of claim 1, wherein the measurement circuit comprises a delay-locked loop.

6. The system of claim 5 wherein the delay-locked loop receives a reference clock signal comprising a reference delay.

7. The system of claim 5, wherein the delay-locked loop comprises a tunable delay element.

8. The system of claim 7, wherein the delay-locked loop comprises a control circuit for adjusting the tunable delay element and for producing a control signal corresponding to the measured delay.

9. The system of claim 5, wherein the delay-locked loop comprises one of a digital delay-locked loop, an analog delay-locked loop, or a hybrid delay-locked loop.

10. The system of claim 1, wherein a value stored in the hardware register comprises at least one of a statically set threshold or a dynamically set threshold.

11. The system of claim 1, further comprising a timer circuit for dynamically adjusting the power supply voltage.

12. The system of claim 1, wherein the transistor-based device is one of a cellular phone, portable music player, portable video player, portable electronics device, A/V receiver, audio device, netbook computer, laptop computer, embedded computer, gaming device, desktop computer, server, automotive electronic device, or medical electronics device.

13. A method for reducing power consumption in a transistor-based device, the method comprising:
    measuring a delay of at least one transistor in the device;
    storing the control signal in a hardware register; and
    adjusting a power supply voltage of the device based at least in part on the measured delay in order to reduce the power consumed by the device without changing the functionality of the device.

14. The method of claim 13, wherein the measuring step comprises generating a control signal corresponding to the measured delay and the adjustment step comprises comparing the control signal to a predetermined threshold.

15. The method of claim 14, further comprising fixing the control signal to a predetermined value.

16. The method of claim 13, wherein the predetermined threshold is one of a minimum control signal and a maximum control signal.

17. The method of claim 13, further comprising dynamically adjusting the power supply voltage at periodic intervals during the operation of the transistor-based device with minimum interference in system operation.

18. The method of claim 13, further comprising adjusting the power supply voltage at the startup of the transistor-based device.

19. The method of claim 13, wherein measuring the delay of the transistor-based device comprises locking a delay loop to a reference frequency.

20. A system for reducing power consumption in a transistor-based chip, the system comprising:
    a measurement circuit for measuring a delay of at least one transistor in the chip and for producing a control signal corresponding to the measured delay;
    a hardware register for storing the control signal;
    a comparator for comparing the control signal to a predetermined threshold; and
    an adjustment circuit for adjusting a power supply voltage of the chip based at least in part on the measured delay in order to reduce the power consumed by the chip without changing the functionality of the chip.

21. The system of claim 20, wherein the transistor-based chip comprises a digital chip, an analog chip, or a mixed-signal chip.

22. The system of claim 20, wherein the transistor-based chip comprises a microprocessor, a digital-signal processor, an amplifier, an embedded processor, or a solid-state storage device.

* * * * *

UNITED STATES PATENT AND TRADEMARK OFFICE
CERTIFICATE OF CORRECTION

PATENT NO. : 8,258,861 B2  
APPLICATION NO. : 12/684319  
DATED : September 4, 2012  
INVENTOR(S) : Wreeju Bhaumik et al.

It is certified that error appears in the above-identified patent and that said Letters Patent is hereby corrected as shown below:

Column 10, lines 22-24, should read;

16. The method of claim [[13]] 14, wherein the predetermined threshold is one of a minimum control signal and a maximum control signal.

Signed and Sealed this
Twenty-eighth Day of May, 2013

Teresa Stanek Rea
*Acting Director of the United States Patent and Trademark Office*